United States Patent [19]

Barnes et al.

[11] 3,750,142

[45] July 31, 1973

[54] SINGLE RAMP ANALOG TO DIGITAL CONVERTER WITH FEEDBACK

[75] Inventors: James A. Barnes, Scottsdale; Donald R. Kesner, Tempe, both of Ariz.

[73] Assignee: Motorola, Inc., Franklin Park, Ill.

[22] Filed: June 9, 1972

[21] Appl. No.: 261,169

[52] U.S. Cl. .......... 340/347 CC

[51] Int. Cl. .......... G08c 5/00

[58] Field of Search .......... 340/347 AD, 347 NT, 340/347 CC; 328/185

[56] References Cited

UNITED STATES PATENTS

| | | | |
|---|---|---|---|
| 3,349,390 | 10/1967 | Glassman | 340/347 NT |
| 3,491,295 | 1/1970 | VanSaun | 340/347 CC |
| 3,701,146 | 10/1972 | Haga | 340/347 NT |
| 3,493,961 | 2/1970 | Hansen | 340/347 CC |

*Primary Examiner*—Maynard R. Wilbur
*Assistant Examiner*—Jeremiah Glassman
*Attorney*—Vincent J. Rauner and Thomas G. Devine

[57] ABSTRACT

The ramp voltage of an analog to digital converter is started at a point below zero and the output of a pulse generator is gated into a counter when the ramp voltage passes through zero. The pulse generator gate is closed when the ramp voltage passes through an unknown analog voltage to be measured or a reference voltage. A calibration cycle is incorporated wherein a known reference voltage should be represented by a known number of pulses. When the number of pulses is too high, the pulse generator may be slowed down or the rate of increase of ramp voltage may be speeded up. If there are too few pulses, the pulse generator may be speeded up or the rate of change of ramp voltage may be slowed down.

32 Claims, 4 Drawing Figures

SINGLE RAMP ANALOG TO DIGITAL CONVERTER WITH FEEDBACK

BACKGROUND OF THE INVENTION

1. Field of the Invention

Analog to digital converters are used for many purposes. Many devices produce analog signals which are to be processed in a digital computer. These analog signals must be rapidly and accurately converted to digital representation in the form of electronic pulses. Also, communication links utilizing digital signals are less susceptible to noise interference than are analog systems. Therefore, conversion from analog to digital for communication purposes is advantageous.

The instrumentation and measurement field also demands heavy use of analog to digital converters. In this latter category, single and dual ramp type analog to digital converters have proved to be very useful.

2. Description of the Prior Art

In the field of industrial instrumentation and laboratory test equipment, use of the single ramp analog to digital converter has been extensive. This type of converter can generate a time gate signal whose length is proportional to an unknown analog voltage input to be measured. This time gate signal allows a series of pulses from a pulse generator to pass into a counter. The length of time gate signal is governed by the time that it takes for a ramp voltage starting at zero to rise to the voltage of the unknown analog input voltage. The ramp voltage is controlled by connecting a source of constant current to a capacitor and charging it. Ordinarily, a differential amplifier receives the unknown analog input voltage and the ramp voltage from the charging capacitor. When the two voltages are equal, the differential amplifier produces an output which is used to terminate the time gate signal. The number of pulses passed into the counter can then be converted into a digital number in whatever code is desired: binary, BCD, gray, or other. The number is then the digital representation of the analog input voltage.

This simple converter suffers from several inaccuracies:

1. The ramp may be non-linear.
2. The starting time and stopping time of the ramp may be uncertain.
3. The ramp may rise too fast or too slow.
4. The pulse generator may run too fast or too slow or it may vary in frequency with time.

One corrective measure has been to start the ramp below the zero reference voltage. Then the time gate signal is started when the ramp voltage crosses zero, by activating a zero crossing detector. A second detector is activated when the ramp voltage equals the unknown analog input voltage. Both detectors can be identical comparator circuits and should therefore operate at identical speeds. Any non-linearity associated with the ramp start up is essentially eliminated using this technique.

Still another prior art improved device is the dual ramp converter. Such a converter includes a pulse generator, a pulse counter, integrating means and control logic for causing the unknown analog input voltage to be applied to the integrating means for a period of time measured by a standard number of pulses to generate a ramp voltage starting at a first energy level. A reference voltage is then used for a time period sufficient to restore the output of the integrating means to the first energy level and to count the number of pulses generated during this time period. The ratio of the input voltage to the reference voltage corresponds to the ratio of the standard number of pulses to the pulses counted during the restoration. The systems have the advantage of having two ramps generated by the same amplifier so that non-linearity errors cancel. They have a major disadvantage in that the system input impedance is limited to the input resistor value, which is too low for a large number of applications. This converter is thus necessarily preceded by a separate precision performance amplifier.

Various feedback arrangements have been used to minimize error. For example, negative feedback loops between the output and one input of a differential amplifier serving as a comparator aids in reducing any drift voltage of the amplifier.

Further, calibration techniques to vary certain of the circuit parameters have been used. A standard time period, for example, is used as a measure against ramp time. This has the disadvantage of requiring precision parts and of being difficult to implement.

Our invention utilizes a total closed-loop feedback system wherein pulses representative of a reference voltage pass into a counter. The resulting member is compared with the correct number and the difference is fed back in the form of a correcting signal to either increase or decrease the speed of the oscillator producing the pulses, or to increase or decrease the rise time of the voltage ramp. The unknown analog input voltage is then measured in the newly calibrated converter. The disadvantages enumerated above are largely dispelled with only the reference voltage as a precision parameter required.

BRIEF SUMMARY OF THE INVENTION

Our analog to digital converter switches alternately between the unknown analog input voltage to be converted and a reference voltage input which is one-half of the full scale voltage which the converter can measure. A complete closed-loop feedback calibration cycle is used whenever connection is made to the reference voltage input. A ramp generator produces a rising voltage which reaches the value of the reference voltage. During the time that the ramp voltage rises until it equals the reference voltage, a pulse generator produces pulses which are gated into a binary counter. In a simple preferred embodiment of our invention, the most significant bit of the counter is monitored. The most significant bit is toggled or switched exactly when the counter reaches the mid-point of the count. Thus if the monitored most significant bit (MSB) is at a voltage level arbitrarily designated "0" at the time that the ramp voltage equals the reference voltage (one-half full scale), the number of pulses passed into the counter is insufficient. Under such circumstances, the pulse generator producing the pulses must be speeded up or the rise time of the voltage ramp must be slowed down. In the reverse situation, when MSB is at a second voltage level arbitrarily designated "1" prior to the ramp voltage equaling the reference voltage, the pulse generator must be slowed down or the ramp voltage must be speeded up. The output of MSB is fed to a correction circuit which generates the actual error control signal to be applied to the pulse generator that produces the counted pulses or to the ramp generator.

After this calibration cycle, the terminals across which the unknown analog input voltage to be converted is applied are contacted, the ramp voltage is started as during the calibration cycle, and pulses are counted until the ramp voltage equals the unknown analog voltage. Contents of the counter are then utilized to indicate the amplitude of the converted analog voltage in numerical form such as binary, BCD, decimal, etc. Following this measurement, another calibration cycle is performed.

The converter has an oscillator whose function is to provide timing signals to activate the gates and switches, all of which will be described in detail later. Also activated are means for distinguishing between the positive and the negative unknown analog input voltage and converting it in either case.

The principle object of this invention is to provide an analog to digital converter having a total closed-loop feedback system for periodic self-calibration.

Another object of this invention is to provide an analog to digital converter capable of converting a negative or positive unknown analog input voltage into a digital representation.

These and other objects will be made evident by the detailed description that follows.

DETAILED DESCRIPTION OF THE INVENTION

Figure 1:
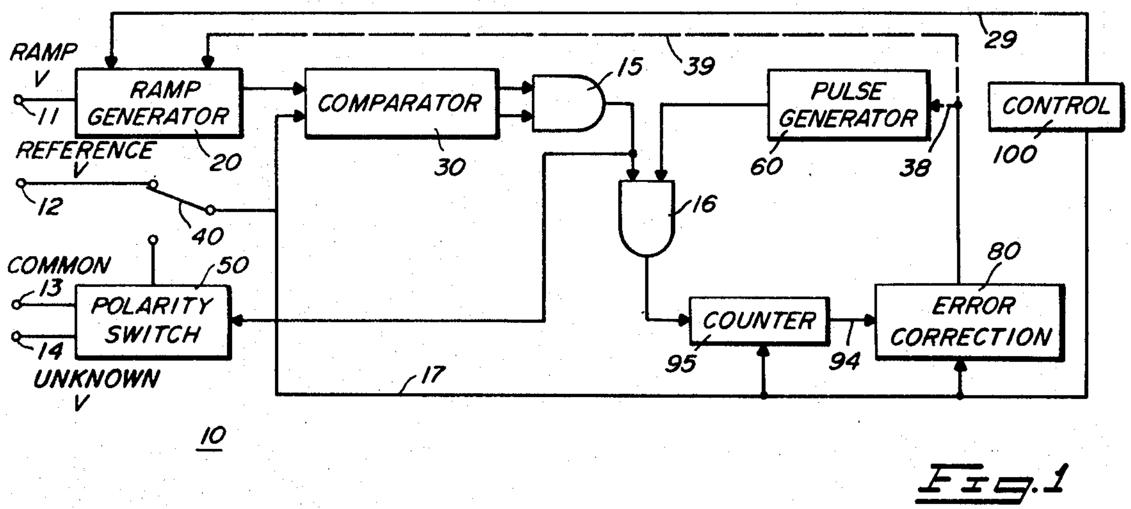
FIG. 1 is a block diagram of the analog to digital converter illustrating an output from the error correction circuit to the pulse generator, or in the alternative, to the ramp generator.

The digital to analog converter 10 of FIG. 1 has a ramp generator 20 supplied by a source of power at terminal 11. The ramp generator 20, of the preferred embodiment, utilizes a technique whereby a negative bias is applied so that the ramp voltage starts at some point below zero, crosses zero and proceeds linearly in a positive direction to a maximum voltage. This technique eliminates non-linearity associated with the ramp start up. Of course, a ramp which starts at zero could be substituted.

A comparator 30 is connected to the output of ramp generator 20 and has, as another input, either a reference voltage applied at terminal 12, or an unknown voltage to be converted applied to terminal 14, determined by the position of switch 40. Polarity switch 50 which has a terminal connected to switch 40, is activated when the unknown voltage applied to terminal 14 is negative with respect to the converter internal ground. Polarity switch 50 enables the conversion of either a positive or negative unknown analog voltage. Comparator 30 has a pair of outputs, one activated when the ramp voltage crosses zero and one deactivated when the ramp voltage reaches either the reference voltage or the unknown voltage. Both outputs are connected to AND circuit 15 whose output is connected to polarity switch 50 and to AND circuit 16. AND circuit 16 has a second input from pulse generator 60 so that the pulses from pulse generator 60 are passed through AND circuit 16 when the output from AND circuit 15 is activated. The pulses pass through AND circuit 16 into counter 95, with an output from the most significant bit of counter 95 applied to error correction circuit 80 through conductor 96. Counter 95 is a standard binary counter, but it should be understood that it could be arranged in binary coded decimal, gray code, etc. Also, any number of bits of the counter could be monitored as determined by the design requirements of the system.

The error correction circuit 80 provides a correction voltage to change the frequency of pulse generator 60 via line 38. In the alternative, it provides a voltage over line 39 to alter the rate of change of the ramp voltage of ramp generator 20.

Control circuit 100 provides the basic timing for the converter system and provides the various control circuits which are detailed below.

Ramp Voltage Generator

The ramp voltage generator 20 includes an operational amplifier 23 of standard design having a capacitor 22 and a transistor switch 21 connected in parallel across its output and its input which is connected through resistor 25 to a source of power at terminal 11. Transistor switch 21 has its base connected through resistor 26 to a source of negative voltage and through resistor 27 and conductor 29 to control circuit 100. As will be explained in detail later, control circuit 100 controls transistor switch 21 to cause it to become nonconductive at an appropriate time to permit the charging of capacitor 22. Operational amplifier 23 is connected to a negative voltage source and its other input is connected to a negative voltage source through resistor 24 and to ground through resistor 28. Operational amplifier 23 is of standard design and in the preferred embodiment is Motorola type MC1741.

Comparator

Figure 2:
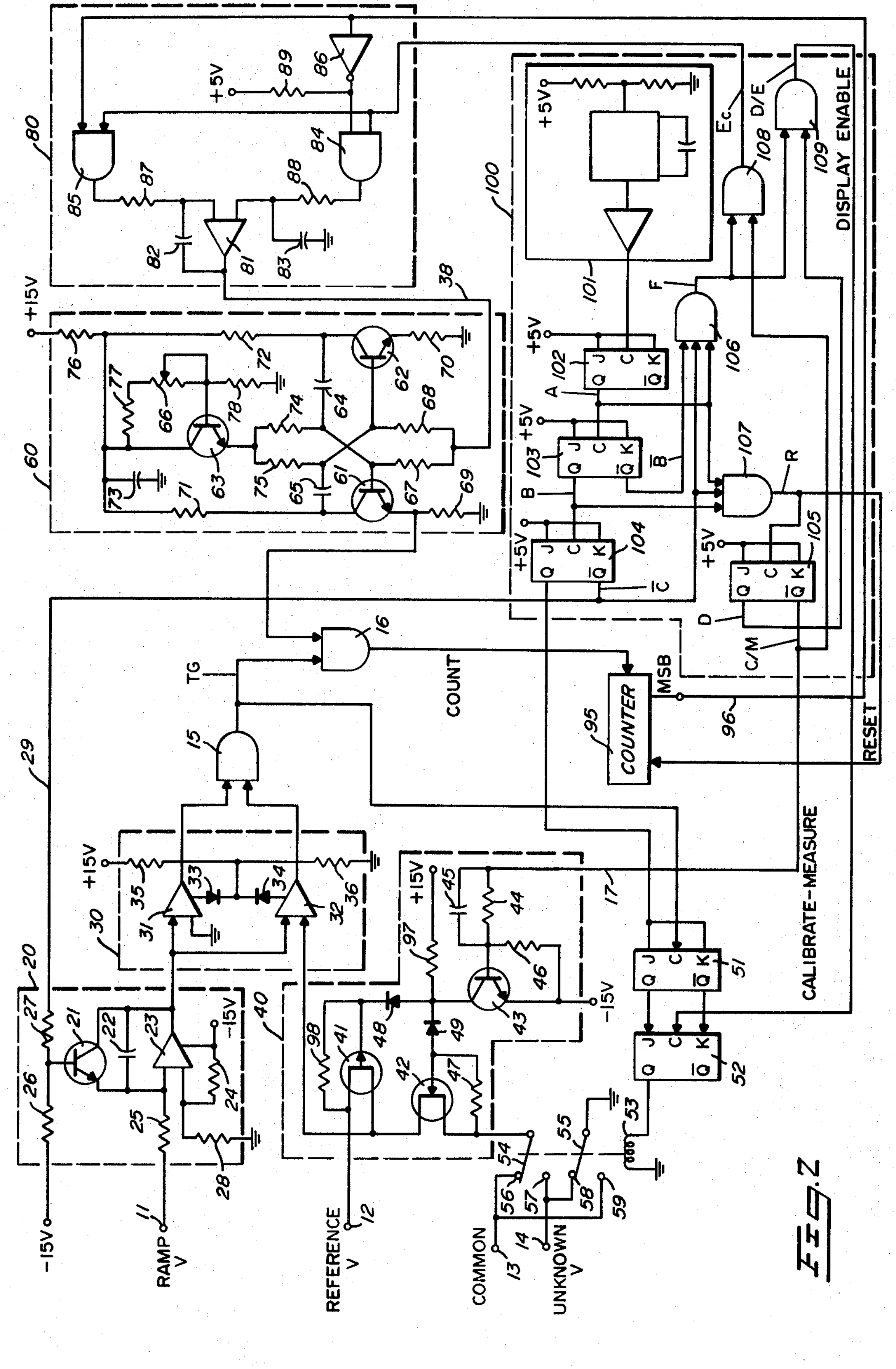
FIG. 2 is a partial schematic, partial block diagram of the analog to digital converter illustrating an output from a correction circuit connected to a variable frequency pulse generator.

The comparator 30 of FIG. 2 includes a pair of identical differential amplifiers 31 and 32 which are interconnected through diodes 33 and 34 to a common point which in turn is connected through resistor 35 to a source of positive voltage and through resistor 36 to ground. The output of ramp generator 20 serves as an input to each of the differential amplifiers 31 and 32. The other input to differential amplifier 31 is the ground reference, while the other input to differential amplifier 32 is from switch 40 so that a reference voltage or unknown analog voltage to be converted may be applied to differential amplifier 32. The outputs of differential amplifiers 31 and 32 serve as the inputs to AND circuit 15.

Pulse Generator

The pulse generator 60 of FIG. 2 is of conventional design, being adjustable in frequency by way of an output from error correction circuit 80 applied over line 38. Transistors 61 and 62 are interconnected to form an adjustable oscillator and a transistor 63 serves as a current source. The base of transistor 61 is connected to the collector of transistor 62 through capacitor 64 and the base of transistor 62 is connected to the collector of transistor 61 through capacitor 65. The respective bases are also connected through identical resistors 74 and 75 to the emitter of transistor 63. Also, the respective bases of transistors 61 and 62 are connected through identical resistors 67 and 68 to input line 38. The emitters of transistors 61 and 62 are connected respectively through resistors 69 and 70 to ground. The collectors of transistors 61 and 62 are connected respectively through resistors 71 and 72 to a source of positive voltage. The emitter of transistor 61 serves as an output of the circuit and is connected to AND circuit 16 whose other input is the output from AND circuit 15. The collector of transistor 63 is also connected to a source of positive voltage. Variable resistor 66 serves as a manual adjustment for the pulse generator output frequency. One end of variable resistor 66 is connected through resistor 78 to ground while the other end is connected through resistor 77 to the collector of transistor 63. Filter capacitor 73 is connected from the collector of transistor 63 to ground.

Control

Control circuit 100 of FIG. 2 has, as a basic component, a fixed frequency oscillator 101. Oscillator 101 is connected to a positive voltage supply and to ground. It is a standard circuit and in the preferred embodiment is a Motorola type MC4024. Its output is connected to the clock input of standard JK flip-flop 102 whose J and K inputs are connected together to a positive voltage. Flip-flops 102, 103, 104 and 105 of the control circuit are all standard JK type flip-flops, being Motorola type MC7473 in the preferred embodiment. These flip-flops are triggered by a negative going edge of a signal applied to the clock input. They each have a Q and a $\bar{Q}$ output. The Q output of flip-flop 102 is shown as signal "A" in FIG. 4 and serves as an input to the clock input of flip-flop 103 whose J and K input are tied together to a source of positive voltage. The Q output of flip-flop 103 carries a signal which is shown as "B" in FIG. 4 and a $\bar{Q}$ output shown as "$\bar{B}$" in FIG. 4. The Q output of flip-flop 103 serves as the clock input to flip-flop 104 and as one of three inputs to AND circuit 107. The J and K inputs to flip-flop 104 are tied together to a source of positive voltage and the $\bar{Q}$ output carries a signal represented by "$\bar{C}$" of FIG. 4. The $\bar{Q}$ output of flip-flop 104 serves as a control, through conductor 29, of transistor switch 21 of the ramp generator 20. The $\bar{Q}$ output of flip-flop 104 also serves as an input to AND circuit 106 and as a second input to AND circuit 107. The third input to AND circuit 107 comes from the Q output of flip-flop 102.

Figure 4:
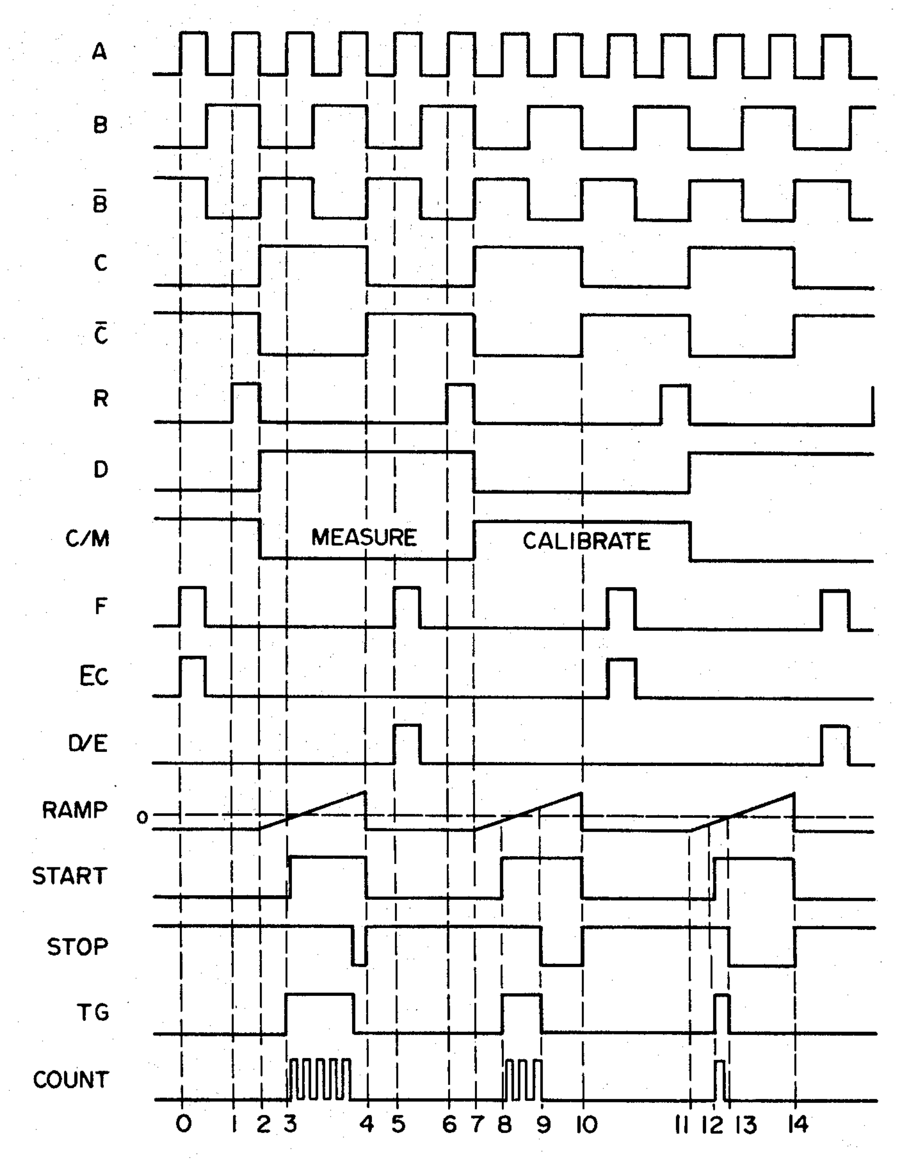
FIG. 4 illustrates idealized electronic signals present at specified points in FIGS. 2 and 3.

The output of AND circuit 107 carries a signal which is shown as "R" in FIG. 4 and serves to reset the counter 95. AND circuit 106 has two additional inputs, one from the Q output of flip-flop 102 and the other from the $\bar{Q}$ output of flip-flop 103. The output signal from AND circuit 106 is shown as "F" in FIG. 4. This "F" waveform serves as an input to AND circuits 108 and 109.

The output of AND circuit 107 serves as the clock input to flip-flop 105 whose J and K inputs are tied together to a source of positive voltage. The $\bar{Q}$ output of flip-flop 105 is shown as signal "C/M" in FIG. 4 and serves to activate switch 40 in alternate fashion. It also serves as the second input to AND circuit 108 whose output is shown as "$E_c$" in FIG. 4.

The Q output of flip-flop 105 is shown as signal "D" in FIG. 4 and serves as the second input to AND circuit 109. The output from AND circuit 109 is shown in FIG. 4 as signal "D/E" and is used as a clock input to flip-flop 52.

Error Correction

Error correction circuit 80 has, as an integral part, an operational amplifier 81 which has a capacitor 82 connected from its output to one of its inputs which is connected through a resistor 87 to the output of AND circuit 85. Its other input is connected through resistors 88 to the output of AND circuit 84 and through capacitor 83 to ground. AND circuit circuits 84 and 85 each have as an input, signal "$E_c$", the output from AND circuit 108. The other output to AND circuit 84 comes from the most significant bit of counter 95 over conductor 96. Conductor 96 also is connected to inverter 86 whose output serves as another input to AND circuit 85. The output of inverter 86 is also connected to a source of positive voltage through resistor 89. The output of operational amplifier 81 serves as an input, through conductor 38, to pulse generator 60.

Switching

Switching is performed electronically using a pair of complementary FET's 41 and 42. A control transistor 43 has its base connected through resistor 44 and capacitor 45 in parallel to the $\bar{Q}$ output of flip-flop 105 to receive a C/M signal. The emitter of transistor 43 is connected to a negative voltage and also is connected through its base to resistor 46. The collector of transistor 43 is connected to a positive source of voltage through resistor 97 and is also connected to the anode of diode 48 and the cathode of diode 49. The cathode of diode 48 is connected to the gate of FET 41 and the anode of diode 49 is connected to the gate of FET 42. FET 42 has one main electrode connected to one main electrode of FET 41, the junction being connected as an input to differential amplifier 32. Resistor 47 is connected between the gate of FET 42 and the other main electrode of FET 42 which is connected to movable contact member 54 of polarity switching circuit 50. Resistor 98 is connected from the gate of FET 41 to the other main electrode of FET 41 which is connected to reference voltage terminal 12.

Polarity Switching Circuit

Flip-flop 51 has its J and K inputs connected together to a source of positive voltage. The output of AND circuit 15 which provides a timing gate signal, is connected to the clock input of flip-flop 51 thus toggling 51 each time a timing gate signal is present. The $\bar{Q}$ output of flip-flop 51 is connected to the J input of flip-flop 52 and the $\bar{Q}$ output of flip-flop 51 is connected to the K input of flip-flop 52. The clock input of flip-flop 52 comes from the output of AND circuit 109. This connection causes the state of flip-flop 52 to follow the state of flip-flop 51 and to produce an output whenever it is toggled. The Q output of flip-flop 52 is connected to coil 53 whose other end is connected to ground. Changing current in coil 53 causes movable contact members 54 and 55 to move between contacts 56 and 57, and 58 and 59 respectively. Common input terminal 13 is connected to contacts 56 and 59 and unknown voltage terminal 14 is connected to terminal 57 and terminal 58.

Miscellaneous

AND circuit 16 passes pulses from the emitter of transistor 61 of the pulse generator 60 to the counter 95 as long as the other input to AND circuit 16 from AND circuit 15 is activated. This other input to AND circuit 16 is referred to as the "timing gate signal."

Figure 3:
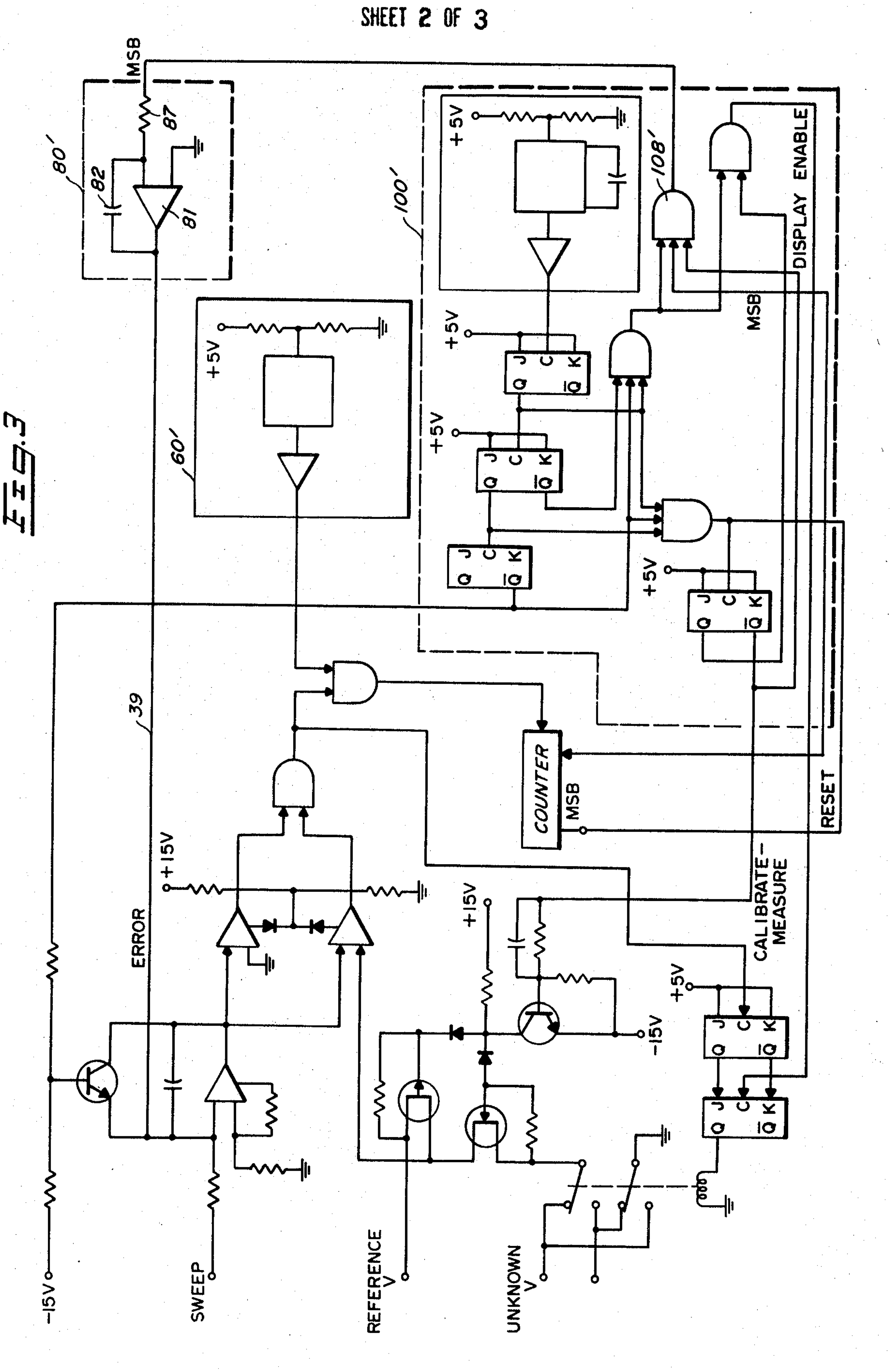
FIG. 3 is a partial schematic, partial block diagram of the analog to digital converter wherein the output from the correction circuit—simplified from that of FIG. 2—is connected to the ramp generator and the pulse generator is of a fixed frequency type.

FIG. 3 is a partial schematic diagram representing another embodiment of this invention. Those components which are identical have been identically numbered in FIGS. 2 and 3 for the sake of clarity. The differences shown in FIG. 3, in general terms, are: (1) a fixed frequency pulse generator $60^1$ instead of variable pulse generator 60, (2) a simplified error correction circuit $80^1$and (3) correction mode to the ramp generator 20 instead of to variable pulse generator 60.

In detail, pulse generator $60^1$ is identical to oscillator 101 of FIGS. 2 and 3. The output of fixed frequency pulse generator $60^1$ is connected in the circuit at the same point as is variable pulse generator 60 of FIG. 2—that is, as an input to AND circuit 16.

FIG. 3 illustrates an alternate correction mode, namely changing the rise rate of the ramp voltage in ramp generator 20. In the embodiment of FIG. 3, the error correction circuit $80^1$ is different and less complex than error circuit 80 of FIG. 2. Error circuit $80^1$ uses the same operational amplifier 81 and the same capacitor 82 from the output of operational amplifier 81 to a first input which is connected through resistor 807 to the output of AND circuit $108^1$ from control circuit $100^1$. The other input to operational amplifier 81 is connected to converter ground. The proper selection of resistor 807 provides an output from error correction circuit $80^1$ on conductor 39 that drifts in a positive direction. Thus upwardly drifting voltage is supplied to ramp generator 20 at the emitter of transistor switch 21, causing the rate of increase in ramp voltage to slow down. When a positive signal comes from AND circuit $108^1$, the output of error correction $80^1$ drops rapidly to zero and causes the rate of increase of ramp voltage to increase.

Control circuit $100^1$ of FIG. 3 is identical to control circuit 100 of FIG. 2 except for the replacement of AND circuit 108 with the aforementioned AND circuit $108^1$, the difference between these AND circuits being the addition of a third input from the most significant bit of the counter to AND circuit $108^1$, thus providing an output only when the most significant bit output is activated.

Referring now to FIG. 4, the various idealized signals have been previously described as to where they occur in the converter. They will be detailed in the description of the operation of the converter that follows.

MODE OF OPERATION

Reference should be made to FIGS. 1, 2 and 4 for understanding the operation of one of the embodiments of this invention. The operation is divided basically into two cycles, the calibrate cycle and the measure cycle. The calibrate cycle will be described first.

Assume that switch 40 is positioned to receive the reference voltage at terminal 12. In the preferred embodiment, the reference voltage is exactly one-half of the full scale voltage possible to be converted. The reference voltage is the critical parameter to insure accuracy of this converter. A value of one-half of the full scale voltage is selected because of ease of monitoring the binary counter. That is to say, the most significant bit of a binary counter changes state at exactly one-half of the total count. This makes monitoring a simple task. Of course, any other precision value of reference voltage could be selected and monitored at the counter, albeit more complex circuitry would be required.

Referring to "$\bar{C}$" signal of FIG. 4, for the calibrate cycle it is shown to go negative at time 7. When $\bar{C}$ goes negative, the base of transistor switch 21 of ramp generator 20 goes more negative and the transistor 21 cuts off, permitting the capacitor 22 to be charged. Capacitor 22 has been biased to a negative voltage so that the ramp voltage as shown on FIG. 4 begins at a negative value of time 7 and crosses zero at time 8.

Up until time 8, when the ramp goes through zero, differential amplifier 31 has produced no output. Differential amplifier 32 however has had an output as a result of having the reference voltage and the ramp voltage as inputs. When differential amplifier 31 produces an output, AND circuit 15 is satisfied, producing the resultant signal TG of FIG. 4. The output, TG, of AND circuit 15 goes positive at time 8 of the zero crossing and is deactivated at time 9 when the ramp voltage passes through the reference voltage thereby deactivating differential amplifier 32.

The output of AND circuit 15 serves as an input to AND circuit 16. Another output from AND circuit 15 serves as a clock input to flip-flop 51 which will be described in connection with the measure cycle. The other input to AND circuit 16 comes from the continually running pulse generator 60. Thus pulses are passed to the counter 95 as long as the output of AND circuit 15 remains positive as illustrated by signal TG. In the calibrate cycle, a counter has been counting and at the time that AND circuit 16 is disabled, will have its most significant bit either in a positive state (arbitrarily designated "1") indicating that the count is too high, or in a more negative state (arbitrarily designated as a binary "0") indicating that the count is too low. In this preferred embodiment, an error signal always results. That is to say, even if the most significant bit switches at exactly the time that AND circuit 16 is disabled, it results in a correction anyway. As will be described in more detail, in the embodiment of FIG. 2, a correction of frequency of the pulse generator 60 is made in an increment of time equal to one-fourth of the time required to count the pulse going into the least significant bit of counter 95. Of course, additional circuitry could be utilized so that there would be no shift when the most significant bit changes from a "0" to a "1" during this calibrate cycle.

Refer now to the control section 100. Assume that flip-flop 102 is cleared, that is, $Q = 0$ and $\bar{Q} = 1$. A pulse received from oscillator 101 into the clock input of flip-flop 102 will cause the flip-flop to toggle so that $Q = 1$ and $\bar{Q} = 0$. This toggling occurs on the negative going edge of the oscillator 101 output, and the Q output of flip-flop 102 is shown as signal A in FIG. 4. It should be noted that signal A divides the oscillator frequency by two. The Q output of flip-flop 102 serves as the clock input to flip-flop 103 and performs a toggle on the negative going edge of signal A. The Q output of 103 then becomes a 1 and the $\bar{Q}$ output becomes a 0. The relationship of these outputs to the clock input is shown in FIG. 4 as signals B, $\bar{B}$ and input A. The Q output of flip-flop 103 is the signal A divided by two. The Q output of flip-flop 103 serves as a clock input to flip-flop 104 which, in the same fashion, is toggled producing a negative $\bar{Q}$ output when toggled as shown in signal $\bar{C}$ in FIG. 4. Signal $\bar{C}$ is signal B divided by two and inverted. The $\bar{Q}$ output of flip-flop 104 serves as an input to AND circuit 106 and to AND circuit 107.

AND circuit 106 receives, as its other two inputs, signals A and $\bar{B}$, the latter being the $\bar{Q}$ output of flip-flop 103. This combination results in signal F as an output from AND circuit 106. This can readily be ascertained from FIG. 4 by noting that when signal A equals 1, $\bar{B}$ equals 1 and $\bar{C}$ equals 1, F will equal 1.

The other two inputs to AND circuit 107 are signal A and signal B. The result is shown as signal R, the output of AND circuit 107. This output serves as a clock input to flip-flop 105 whose $\bar{Q}$ output is the R input divided by two and whose Q output is the inversion of the Q output. The R signal is 1 only when A equals 1, B equals 1 and $\bar{C}$ equals 1. The R signal is used also to cause the reset of the counter 95 after a calibrate or a measure cycle.

The output F of AND circuit 106 serves as an input to AND circuits 108 and 109. The other input to AND circuit 108 is the $\bar{Q}$ output of 105, namely the signal C/M as shown in FIG. 4.

The output signal $E_c$ of AND circuit 108 is used to gate the error signal as inverted through AND circuit 85 and the error signal through AND circuit 84 of error correction circuit 80. Depending upon the state of the most significant bit on line 96, a voltage will be presented to the operational amplifier 81 on resistor 87 or on resistor 88. The output will then present a lesser or greater current to the resistors 67 and 68 of pulse generator 60 to change its frequency in the proper direction—that is increase it by one-fourth of the least significant bit switching time if the most significant bit equals zero, and decrease it by one-fourth of the least significant bit switching time if the most significant bit equals 1. The output of AND circuit 109 is a zero during the calibrate cycle because signal D output of flip-flop 105 equals zero during the calibrate cycle and, as will be explained is not needed for the calibration cycle.

Note that the $\bar{Q}$ output of flip-flop 105, which is signal C/M, is applied to the base of transistor 43 of switch 40 and is positive during the calibrate cycle, thus turning on transistor 43. With transistor 43 turned on, a negative voltage is presented to diodes 48 and 49, reverse biasing diode 49 and forward biasing diode 48. A negative voltage therefore turns on field effect transistor 41, thereby conducting the reference voltage to comparator 30. When transistor 43 is turned off, a positive voltage is applied to the junction of diodes 48 and 49, and field effect transistor 42 is turned on thereby applying the unknown voltage instead of the reference voltage to the comparator 30. The calibration cycle comes to an end when the $\bar{Q}$ output of flip-flop 104, signal $\bar{C}$, goes positive at time 10, turning on switch transistor 21 of ramp generator 20. With transistor 21 turned on, capacitor 22 is now enabled to discharge, thus returning the ramp generator 20 to its quiescent state of some voltage below zero.

Immediately following the calibration cycle is a measure cycle. An inspection of the C/M signal of FIG. 4 graphically illustrates these cycles. For example, at time 2 it can be seen that the C/M signal goes to zero. This voltage is applied from the $\bar{Q}$ output of flip-flop 105 to the base of transistor 43 of switch 40, turning it off. As indicated above, field effect transistor 42 will be turned on thereby transmitting the unknown analog input voltage to be converted to the comparator 30. Also at time 2, signal $\bar{C}$ goes negative, turning off switch transistor 21, thereby enabling the ramp voltage to start rising. As in the calibrate cycle, the ramp voltage passes through zero and activates the zero crossing detector of differential amplifier 31 producing the timing gate pulse TG out of AND circuit 15. This pulse applied to AND gate 16 permits pulses from pulse generator 60 to pass into counter 95.

An arbitrary, high unknown voltage was selected for purposes of example and therefore the differential amplifier 32 is deactivated nearly at the end of the sweep as illustrated by the stop signal going negative just before time 4. AND circuit 15 is deactivated thereby causing the TG signal to go to zero thus blocking the output of pulse generator 60 from entering counter 95. Signal $\bar{C}$ from the $\bar{Q}$ output of flip-flop 104 goes to zero at time 4 thus returning the ramp generator to its quiescent state.

Note that the signal $E_c$ out of AND circuit 108 remains zero throughout the measure cycle. The error correction circuit 80 is therefore not activated and the frequency of pulse generator 60 is consequently not changed during the measure cycle—as expected. Also note that a D/E signal occurs during the measure cycle. This comes from AND circuit 109 and is applied to the clock input of flip-flop 52. Flip-flop 52 is part of the polarity switch 50 whose operation will now be described.

Assume that during the last measure cycle, a positive voltage was measured and that after the calibration cycle that followed, the polarity switch 50 was left in position shown in FIG. 2. Now assume that a negative voltage is applied to terminal 13 and a ground voltage applied to terminal 14. Under these conditions, the zero crossing detector differential amplifier 31 will detect the zero crossing of the ramp, but differential amplifier 32 will remain deactivated because of the negative voltage applied to it thus keeping AND gate 15 disabled, thus permitting no TG signal to gate pulses from pulse generator 60 through AND gate 16 into counter 95. Therefore, there is no measurement during this measure cycle.

The calibration cycle that follows, produces an output from AND gate 15 as described above. This is the TG signal shown in FIG. 4. It goes negative at time 9 thus changing the state of flip-flop 51. Assume that Q now equals 1 and $\bar{Q}$ equals 0. Even though there was no TG signal generated during the previous measure cycle, there was a D/E signal generated whose negative edge had toggled flip-flop 52. Since flip-flop 51 was cleared prior to the most recent TG signal, flip-flop 52 would also have been forced to the cleared state. Without a D/E signal generated during the calibration cycle, flip-flop 52 remains cleared.

On the next measure cycle, there will be no TG signal generated but there will be a D/E signal applied to the C input of flip-flop 52 which will trigger on the negative edge of the signal. When flip-flop 52 triggers, its Q output becomes a 1 thus sending a current through coil 53, activating the contact members 54 and 55 to move to contacts 56 and 58 respectively. When this is accomplished, the negative voltage appearing at the terminal 14 is conducted through member 55 to the ground of the converter. The input on the common terminal 13 becomes positive with reference to the ground of the converter itself and is transmitted through member 54 to switch 40. Another calibration cycle occurs, but flip-flop 52 remains unchanged because there is no D/E signal. However, flip-flop 51 changes state because a TG signal occurs during the calibrate cycle. During the next measure cycle, another TG signal changes flip-flop 51 again so that the D/E pulse that occurs does not change the state of flip-flop 52 because of its connection to force the following of the state of flip-flop 51 by flip-flop 52. Therefore, the polarity switch 50 remains unchanged.

In the case where zero volts are applied to the terminal 14, assuming that the polarity switch 50 has not changed state, there is no TG signal generated because the differential amplifier 32 is deactivated before or when differential amplifier 31 is activated. This results in no toggling of flip-flop 51 and therefore no toggling of flip-flop 52 when the D/E signal is received. However, when the calibration cycle produces a TG signal which toggles flip-flop 51, it will be toggled by the next measure cycle which again produces a D/E signal.

The Q output of flip-flop 104 (signal C of FIG. 4) goes positive at the start of the measure and the calibration cycle and goes negative during the last half of each cycle. This signal serves as the J and K inputs to flip-flop 51 and insures that no spurious signal generated by the return of the ramp voltage to its quiescent voltage level causes an unwanted toggling of flip-flop 51.

Now assume that a positive voltage is applied to the terminal 14 with the polarity switch as shown in FIG. 2. Under these circumstances, the common terminal is negative with respect to converter ground and therefore there is no TG signal generated. During the previous measure cycle, a D/E pulse triggered flip-flop 52 to the same state as flip-flop 51. Then during the current measure cycle, flip-flop 52 will not change state and there will be no change in the state of the polarity switch 50. During the next calibration cycle however, there will be a TG signal and flip-flop 51 will change state. There will be no D/E signal and therefore flip-flop 52 will not change state. The next measure cycle, there will be no TG signal so flip-flop 51 will not change state but there will be a D/E signal which will cause flip-flop 52 to change state thereby causing a current to flow through coil 53 which will cause the members 54 and 55 to move to contacts 57 and 59 respectively.

The next calibration cycle will cause flip-flop 51 to change state. The following measure cycle, flip-flop 51 will again change state so that flip-flop 51 and flip-flop 52 are in the same state. Therefore, when the D/E signal is applied to flip-flop 52 it will not change state and polarity switch 50 will remain unchanged until another negative voltage is applied to terminal 14.

It is apparent therefore, that this converter system is able to differentiate between zero volts or any positive voltage or any negative voltage. This feature, as described above, is most advantageous.

FIG. 3 illustrates another embodiment of this invention. In general, it is different from the embodiment of FIG. 2 in that the correction is made to the speed of the ramp generator 20 rather than to the repetition rate of pulse generator 60. Also, the error correction circuit $80^1$ is simpler in structure than error circuit 80 of FIG. 2. The difference between error circuit $80^1$ and error circuit 80 results in a simple change in the control circuit $100^1$ as compared to control circuit 100.

It should be understood that error circuit $80^1$ could be used to alter the repetition rate of pulse generator 60 as well as altering the rate of ramp generator 20. Also, it is possible to alter both the rate of pulse generator 60 and ramp generator 20. Under certain circumstances this may be desirable, and those with ordinary skill in the art could provide inputs from either correction circuit 80 or correction circuit $80^1$ to the pulse generator 60 and/or the ramp generator 20. The difference between the embodiment of FIG. 2 and that of FIG. 3 is principally in the difference in the error correction circuits. Therefore, please refer to error correction circuit $80^1$ of FIG. 3. There it can be seen that a single input comes into differential amplifier 81 (the same differential amplifier type as that of FIG. 2) through resistor 807. The resistor 807 is selected so that there will be a gradual positive drift of voltage output from differential amplifier 81 which, in the embodiment of FIG. 3, is applied through line 39 to ramp generator 20, causing it to slow down.

To accommodate the single input to error correction circuit $80^1$, there has been a slight modification to control circuit 100 of FIG. 2 as shown in control circuit $100^1$ of FIG. 3, specifically to AND circuit 108 of FIG. 2. AND circuit 108 has two inputs and AND circuit $108^1$ of FIG. 3 has three inputs. The third input in FIG. 3 is the most significant bit output on line 96 from counter 95. This is a simplification in circuitry because the correction circuit $80^1$ is activated only when the most significant bit output of counter 95 is one. Therefore there is no need for the dual input to correction circuit $80^1$.

In FIG. 3, the error correction signal is applied to the ramp generator 20 and not to the pulse generator $60^1$ and therefore $60^1$ is a simple, non-adjustable oscillator of the exact type that is used for oscillator 101 of control circuit 100 and control circuit $100^1$.

To summarize, this invention involves a logic feedback which is wholly encompassing in that the error, if any, in a calibration cycle is itself used to adjust parameters so that the following cycle which converts an unknown voltage to a binary representation is calibrated to do so accurately. Further, the system will recognize a negative voltage and change it to a binary representation and it also will differentiate a zero input from either a positive voltage or a negative voltage. The implementation of this invention can be made in any number of logic and circuit configurations but the spirit and scope of this invention contemplate these variations.

We claim:

1. An analog to digital converter for providing a digital representation of the amplitude of an unknown analog input voltage, having ramp generating means for generating a linearly increasing ramp voltage starting from a first predetermined voltage level, comprising:

*a.* input means, including switching means, for selectively receiving a reference voltage and for selectively receiving the unknown analog input voltage;

*b.* comparator means connected to the input means for selectively comparing the amplitude of the ramp voltage with the reference voltage or with the unknown voltage and for producing a timing gate signal starting at a specified time relative to the start of the linear increase of the ramp voltage and stopping when the ramp voltage equals the reference voltage or the unknown voltage;

*c.* variable frequency pulse generating means for providing a series of electronic pulses;

*d.* counting means having a comparison output, for counting the pulses provided by the pulse generating means, responsive to the comparator means to count only during the timing gate signal;

e. control means connected to the input means for causing the switching means to switch to the reference voltage to provide a calibration cycle and to switch to the unknown voltage to provide a measure cycle; and f. error correction means responsive to the control means to be activated during the calibration cycle, connected to the comparison output of the counting means, for comparing the number of pulses counted by the counting means with a predetermined number and for increasing or decreasing the repetition rate of the pulse generating means when the count is less than, or more than the predetermined number, respectively.

2. The converter of claim 1 wherein the control means are operatively connected to the ramp generating means to return the ramp voltage to the first predetermined voltage level after a calibration or measure cycle and connected to the counting means to clear the counting means after a calibration or measure cycle.

3. The converter of claim 2 further comprising:

g. polarity switching means, for receiving the unknown voltage, connected to the input means and the control means, for determining the polarity of the unknown voltage with respect to converter ground voltage and effectively reversing the polarity if it is negative.

4. The converter of claim 2 wherein the comparator means further comprise:

b. i. a first differential amplifier having one input from the ramp generating means and another input from converter ground voltage to cause the first differential amplifier to be activated when the ramp voltage reaches converter ground voltage;

ii. A second differential amplifier having one input from the ramp generating means and another input from the switching means of the input means, to cause the second differential amplifier to be activated until the ramp voltages reaches either the reference voltage during a calibration cycle, or the unknown voltage during a measure cycle, when the second differential amplifier becomes deactivated;

iii. a first gate having an input from each of the first differential amplifier and the second differential amplifier, to cause the gate to be activated from the time of the activation of the first differential amplifier to the time of the deactivation of the second differential amplifier, producing a timing gate signal at its output; and iv. a second gate having an input from the first gate and from the pulse generating means and having an output to the counting means, to permit pulses from the pulse generating means to pass to the counting means during the timing gate signal.

5. The converter of claim 3 wherein the comparator means further comprise:

b. i. a first differenial amplifier having one input from the ramp generating means and another input from converter ground voltage to cause the first differential amplifier to be activated when the ramp voltage reaches converter ground voltage;

ii. a second differential amplifier having one input from the ramp generating means and another input from the switching means of the input means, to cause the second differential amplifier to be activated until the ramp voltage reaches either the reference voltage during a calibration cycle, or the unknown voltage during a measure cycle, when the second differential amplifier becomes deactivated;

iii. a first gate having an input from each of the first differential amplifier and the second differential amplifier, to cause the gate to be activated from the time of the activation of the first differential amplifier to the time of the deactivation of the second differential amplifier, producing a timing gate signal at its output; and iv. a second gate having an input from the first gate and from the pulse generating means and having an output to the counting means, to permit pulses from the pulse generating means to pass to the counting means during the timing gate signal.

6. The converter of claim 4 wherein the control means further comprise:

e. i. an oscillatr, for providing timing to the converter;

ii. first, second and third flip-flops with the first flip-flop having the oscillator output as an input and connected to divide the oscillator frequency by two, the second flip-flop connected to the first flip-flop to divide the once-divided frequency by two, and the third flip-flop connected to the second flip-flop to divide the twice-divided frequency by two;

iii. first and second AND circuits, the first AND circuit having a first input from the Q output of the first flip-flop, a second input from the Q output of the second flip-flop and a third input from the $\bar{Q}$ output of the third flip-flop to produce a reset signal on its output for resetting the counting means, and the second AND circuit having a first input from the Q output of the first flip-flop, the second input from the $\bar{Q}$ output of the second flip-flop and a third input from the $\bar{Q}$ output of the third flip-flop;

iv. a fourth flip-flop having an input from the first AND circuit for producing a calibration-measure signal on its $\bar{Q}$ output which is connected to the switching means of the input means to cause the switching means to switch alternately between the reference voltage and the unknown voltage; and v. a third AND circuit having the $\bar{Q}$ output of the fourth flip-flop as an input and the output of the second AND circuit as another input, to produce an error correction activating signal during the calibration cycle, on its output which is connected to the error correction means.

7. The converter of claim 5 wherein the control means further comprise:

e. i. an oscillator, for providing timing to the converter;

ii. first, second and third flip-flops with the first flip-flop having the oscillator output as an input and connected to divide the oscillator frequency by two, the second flip-flop connected to the first flip-flop to divide the once-divided frequency by two, and the third flip-flop connected to the second flip-flop to divide the twice-divided frequency by two;

iii. first and second AND circuits, the first AND circuit having a first input from the Q output of the first flip-flop, a second input from the Q output of the second flip-flop and a third input from the $\bar{Q}$ output of the third flip-flop to produce a reset signal on its output for resetting the counting means, and the second AND circuit having a first input from the Q output of the first flip-flop, the second input from the $\bar{Q}$ output of the second flip-flop and a third input from the $\bar{Q}$ output of the third flip-flop;

*iv.* a fourth flip-flop having an input from the first AND circuit for producing a calibration-measure signal on its $\bar{Q}$ output which is connected to the switching means of the input means to cause the switching means to switch alternately between the reference voltage and the unknown voltage;

*v.* a third AND circuit having the $\bar{Q}$ output of the fourth flip-flop as an input and the output of the second AND circuit as another input, to produce an error correction activating signal during the calibration cycle, on its output which is connected to the error correction means; and

*vi.* a fourth AND circuit having one input from the second AND circuit and the Q output of the fourth flip-flop as another input and having an output connected to the polarity detecting means for producing a signal only during the measure cycle.

8. The converter of claim 7 wherein the counting means further comprise a binary counter having an input from the second gate of the comparator means and having a reset input from the first AND circuit of the control means, and having a comparison output from the most significant bit.

9. The converter of claim 8 wherein the error correction means further comprise:

*f. i.* first and second gates, each having as one input the error correction activating signal from the third AND circuit of the control means, the other input to the first gate being the most significant bit output of the counter;

*ii.* an inverter, having the most significant bit output of the counter as its input, its output serving as the other input to the second gate; and

*iii.* an operational amplifier, having as its inputs the outputs of the first and second gates respectively and having its output connected to the input of the variable frequency pulse generating means.

10. The converter of claim 9 wherein the polarity switching means further comprise:

*g. i.* a fifth flip-flop having the timing gate signal from the first gate of the comparator means as an input;

*ii.* a sixth flip-flop connected to follow the state of the fifth flip-flop when its input receives the signal from the fourth AND circuit of the control means; and

*iii.* an electromechanical switch having a coil connected to the output of the sixth flip-flop to be activated by a change of state of the sixth flip-flop and having a first and a second movable contact member, the pivot end of the first member being connected to converter ground and the pivot end of the second member being connected to the switching means of the input means, the first member being connected at its movable end to the common terminal in a first position and the second member being connected to the unknown voltage terminal in the first position, the first member being connected at its movable end to the unknown voltage terminal in a second position, and the second member being connected at its movable end to the common terminal in the second position, the members being activated to move between the first and second positions and the second and first positions whenever the coil is activated so that in the second position a negative voltage applied to the unknown voltage terminal will cause the unknown voltage ground applied at the common terminal to appear positive with respect to the converter ground.

11. An analog to digital converter for providing a digital representation of the amplitude of an unknown analog input voltage, having ramp generating means for generating a linearly increasing ramp voltage starting from a first predetermined voltage level, comprising:

*a.* input means, including switching means, for selectively receiving a reference voltage and for selectively receiving the unknown analog input voltage;

*b.* comparator means connected to the input means for selectively comparing the amplitude of the ramp voltage with the reference voltage or with the unknown voltage and for producing a timing gate signal starting at a specified time relative to the start of the linear increase of the ramp voltage and stopping when the ramp voltage equals the reference voltage or the unknown voltage;

*c.* fixed frequency pulse generating means for providing a series of electronic pulses;

*d.* counting means having a comparison output, for counting the pulses provided by the pulse generating means, responsive to the comparator means to count only during the timing gate signal;

*e.* control means connected to the input means for causing the switching means to switch to the reference voltage to provide a calibration cycle and to switch to the unknown voltage to provide a measure cycle; and

*f.* error correction means responsive to the control means to be activated during the calibration cycle, connected to the comparison output of the counting means for comparing the number of pulses counted by the counting means with a predetermined number and for decreasing or increasing the rate of rise of the ramp voltage when the count is less than, or more than the predetermined number, respectively.

12. The converter of claim 11 wherein the control means are operatively connected to the ramp generating means to return the ramp voltage to the first predetermined voltage level after a calibration or measure cycle and connected to the counting means to clear the counting means after a calibration or measure cycle.

13. The converter of claim 12 further comprising:

*g.* polarity switching means, for receiving the unknown voltage, connected to the input means and the control means, for determining the polarity of the unknown voltage with respect to converter ground voltage and effectively reversing the polarity if it is negative.

14. The converter of claim 12 wherein the comparator means further comprise:

*b. i.* a first differential amplifier having one input from the ramp generating means and another input from converter ground voltage to cause the first differential amplifier to be activated when the ramp voltage reaches converter ground voltage:

*ii.* a second differential amplifier having one input from the ramp generating means and another input from the switching means of the input means, to cause the second differential amplifier to be activated until the ramp voltage reaches either the reference voltage during a calibration cycle, or the unknown voltage during a measure cycle, when the second differential amplifier becomes deactivated;

*iii.* a first gate hAving an input from each of the first differential amplifier and the second differential amplifier, to cause the gate to be activated from the time of the activation of the first differential amplifier to the time of the deactivation of the second differential amplifier, producing a timing gate signal at its output; and

*iv.* a second gate having an input from the first gate and from the pulse generating means and having an output to the counting means, to permit pulses from the pulse generating means to pass to the counting means during the timing gate signal.

15. The converter of claim 13 wherein the comparator means further comprise:

*b. i.* a first differential amplifier having one input from the ramp generating means and another input from converter ground voltage to cause the first differential amplifier to be activated when the ramp voltage reaches converter ground voltage;

*ii.* a second differential amplifier having one input from the ramp generating means and another input from the switching means of the input means, to cause the second differential amplifier to be activated until the ramp voltage reaches either the reference voltage during a calibration cycle, or the unknown voltage during a measure cycle, when the second differential amplifier becomes deactivated;

*iii.* a first gate having an input from each of the first differential amplifier and the second differential amplifier, to cause the gate to be activated from the time of the activation of the first differential amplifier to the time of the deactivation of the second differential amplifier, producing a timing gate signal at its output; and

*iv.* a second gate having an input from the first gate and from the pulse generating means and having an output to the counting means, to permit pulses from the pulse generating means to pass to the counting means during the timing gate signal.

16. The converter of claim 14 wherein the control means further comprise:

*e. i.* an oscillator, for providing timing to the converter;

*ii.* first, second and third flip-flops with the first flip-flop having the oscillator output as an input and connectzd to divide the oscillator frequency by two, the second flip-flop connected to the first flip-flop to divide the once-divided frequency by two, and the third flip-flop connected to the second flip-flop to divide the twice-divided frequency by two;

*iii.* first and second AND circuits, the first AND circuit having a first input from the Q output of the first flip-flop, a second input from the Q output of the second flip-flop and a third input from the $\bar{Q}$ output of the third flip-flop to produce a reset signal on its output for resetting the counting means, and the second AND circuit having a first input from the Q output of the first flip-flop, the second input from the $\bar{Q}$ output of the second flip-flop and a third input from the $\bar{Q}$ output of the third flip-flop;

*iv.* a fourth flip-flop having an input from the first AND circuit for producing a calibration-measure signal on its $\bar{Q}$ output which is connected to the switching means of the input means to cause the switching means to switch alternately between the reference voltage and the unknown voltage; and

*v.* a third AND circuit having the $\bar{Q}$ output of the fourth flip-flop as an input, the output of the second AND circuit as another input and having the comparison output of the counting means as a third input, to produce an error correction activating signal during the calibration cycle on its output which is connected to the error correction means.

17. The converter of claim 16 wherein the control means further comprise:

*e. i.* an oscillator, for providing timing to the converter;

*ii.* first, second and third flip-flops with the first flip-flop having the oscillator output as an input and connected to divide the oscillator frequency by two, the second flip-flop connected to the first flip-flop to divide the once-divided frequency by two, and the third flip-flop connected to the second flip-flop to divide the twice-divided frequency by two;

*iii.* first and second AND circuits, the first AND circuit having a first input from the Q output of the first flip-flop, a second input from the Q output of the second flip-flop and a third input from the $\bar{Q}$ output of the third flip-flop to produce a reset signal on its output for resetting the counting means, and the second AND circuit having a first input from the Q output of the first flip-flop the second input from the $\bar{Q}$ output of the second flip-flop and a third input from the $\bar{Q}$ output of the third fiP-flOp;

*iv.* a fourth flip-flop having an input from the first AND circuit for producing a calibration-measure signal on its $\bar{Q}$ output which is connected to the switching means of the input means to cause the switching means to switch alternately between the reference voltage and the unknown voltage;

*v.* a third AND circuit having the $\bar{Q}$ output of the fourth flip-flop as an input, the output of the second AND circuit as anOther input and having the comparison output of the counting means as a third input, to produce an error correction activating signal during the calibration cycle on its output which is connected to the error correction means; and

*vi,* a fourth AND circuit having one input from the second AND circuit and the Q output of the fourth flip-flop another input and having an output connected to the polarity detecting means for producing a signal only during the measure cycle.

18. The converter of claim 17 wherein the counting means further comprises a binary counter having an input from the second gate of the comparator means and having a reset input from the first AND circuit of the control means, and having a comparison output from the most significant bit.

19. The converter of claim 18 wherein the error correction means further comprise:

f. i. an operational amplitude having one input connected to converter ground and having the other input connected to the output of the third AND circuit of the control means to receive the error correction activating signal, and having an output connected to the ramp generating means.

20. The converter of claim 19 wherein the polarity switching means further comprise:

g. i. a fifth flip-flop having the timing gate signal from the first gate of the comparator means as an input;

ii. a sixth flip-flop connected to follow the state of the fifth flip-flop when its input receives the signal from the fourth AND circuit of the control means; and iii. an electromechanical switch having a coil connected to the output of the sixth flip-flop to be activated by a change of state of the sixth flip-flop and having a first and a second movable contact member, the pivot end of the first member being connected to converter ground and the pivot end of the second member being connected to the switching means of the input means, the first member being connected at its movable end to the common terminal in a first position and the second member being connected to the unknown voltage terminal in the first position, the first member being connected at its movable end to the unknown voltage terminal in a second position, and the second member being connected at its movable end to the common terminal in the second position, the members being activated to move between the first and second positions and the second and first positions whenever the coil is activated so that in the second position a negative voltage applied to the unknown voltage terminal will cause the unknown voltage ground applied at the common terminal to appear positive with respect to the converter ground.

21. A method of converting an unknown analog voltage signal into a digital voltage representation of the amplitude of the analog signal, comprising the steps of:

a. generating a ramp voltage, starting from a first predetermined level and causing the ramp voltage to linearly rise;

b. providing a reference voltage;

c. comparing the ramp voltage and the reference voltage;

d. providing a first timing gate signal starting at a second predetermined level of the ramp voltage and ending when the ramp voltage and the reference voltage are equal;

e. producing a series of digital pulses and counting the pulses during the duration of the timing gate signal;

f. comparing the digital pulses counted with a predetermined number;

g. increasing the repetition rate of the digital pulses if the predetermined number is larger than the count and decreasing the repetition rate if the predetermined number is Smaller than the count;

h. dropping the ramp voltage to the first predetermined level and starting the linear rise again;

i. comparing the ramp voltage with the unknown signal voltage;

j. producing a second timing gate signal starting at the second predetermined level of the ramp voltage and ending when the ramp voltage and the unknown signal voltage are equal; and k. counting the digital pulses during the second timing gate signal.

22. The method of claim 21, after step h, further comprising the steps of:

l. determining the polarity of the unknown signal voltage; and m. inverting the unknown signal voltage if it is negative.

23. The method of claim 22 further comprising the step of:

n. displaying the count as a number.

24. The method of claim 23 further comprising the steps of:

o. dropping the ramp voltage to the first predetermined level; and p. starting the linear rise and repeating steps a through o as desired.

25. The method of claim 24 wherein the first and second predetermined levels are the same.

26. The method of claim 24 wherein the first predetermined level is a negative voltage and the second predetermined level is zero volts.

27. A method of converting an unknown analog voltage signal into a digital voltage representation of the amplitude of the analog signal, comprising the steps of:

a. generating a ramp voltage, starting from a first predetermined level and causing the ramp voltage to linearly rise;

b. providing a reference voltage;

c. comparing the ramp voltage and the reference voltage;

d. producing a first timing gate signal starting at a second predetermined level of the ramp voltage and ending when the ramp voltage and the reference voltage are equal;

e. producing a series of digital pulses and counting the pulses during the duration of the timing gate signal;

f. comparing the digital pulses counted with a predetermined number;

g. decreasing the rate of the linear rise of the ramp voltage if the predetermined number is larger than the count, and increasing the rate if the predetermined number is smaller than the count;

h. dropping the ramp voltage to the first predetermined level and starting the linear rise again;

i. comparing the ramp voltage with the unknown signal voltage;

j. producing a second timing gate signal starting at the second predetermined level of the ramp voltage and ending when the ramp voltage and the unknown signal voltage are equal; and k. counting the digital pulses during the second timing gate signal.

28. The method of claim 27, after step h, further comprising the steps of:

l. determining the polarity of the unknown signal voltage; and m. inverting the unknown signal voltage if it is negative.

29. The method of claim 28 further comprising the step of:

*n*. displaying the count as a number.

30. The method of claim 29 further comprising the steps of:

*o*. dropping the ramp voltage to the first predetermined level; and

*p*. starting the linear rise and repeating steps a through o as desired.

31. The method of claim 30 wherein the first and second predetermined levels are the same.

32. The method of claim 31 wherein the first predetermined level is a negative voltage and the second predetermined level is zero volts.

* * * * *